United States Patent
Lee

(10) Patent No.: US 9,535,623 B1
(45) Date of Patent: *Jan. 3, 2017

(54) MEMORY MODULE CAPABLE OF HANDSHAKING WITH A MEMORY CONTROLLER OF A HOST SYSTEM

(71) Applicant: Netlist, Inc., Irvine, CA (US)

(72) Inventor: Hyun Lee, Ladera Ranch, CA (US)

(73) Assignee: Netlist, Inc., Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/169,745

(22) Filed: Jun. 1, 2016

Related U.S. Application Data

(63) Continuation of application No. 15/088,115, filed on Apr. 1, 2016, which is a continuation of application No. 13/942,721, filed on Jul. 16, 2013, now Pat. No. 9,311,116, which is a continuation of application No. 12/815,339, filed on Jun. 14, 2010, now Pat. No. 8,489,837.

(60) Provisional application No. 61/186,799, filed on Jun. 12, 2009.

(51) Int. Cl.
*G06F 12/00* (2006.01)
*G06F 3/06* (2006.01)
*G06F 11/10* (2006.01)
*G11C 29/52* (2006.01)

(52) U.S. Cl.
CPC .......... *G06F 3/0632* (2013.01); *G06F 3/0619* (2013.01); *G06F 3/0659* (2013.01); *G06F 3/0673* (2013.01); *G06F 11/1068* (2013.01); *G11C 29/52* (2013.01)

(58) Field of Classification Search
USPC .......................................... 711/170
See application file for complete search history.

(56) References Cited

U.S. PATENT DOCUMENTS

| | | |
|---|---|---|
| 4,672,570 A | 6/1987 | Benken |
| 5,450,576 A | 9/1995 | Kennedy |
| 5,511,152 A | 4/1996 | Lai et al. |
| 5,684,979 A | 11/1997 | Grimes |
| 6,763,437 B1 | 7/2004 | Nguyen et al. |
| 6,886,109 B2 | 4/2005 | Olarig et al. |
| 7,024,518 B2 | 4/2006 | Halbert et al. |
| 7,065,688 B1 | 6/2006 | Moyes et al. |
| 7,093,115 B2 | 8/2006 | Poisner et al. |

(Continued)

*Primary Examiner* — Mardochee Chery
(74) *Attorney, Agent, or Firm* — Jamie J. Zheng, Esq.

(57) ABSTRACT

A memory module is operable with a memory controller of a host computer system. The memory module includes a module controller having an open drain output. The module controller generates a parity error signal and drives the parity error signal to the memory controller of the host system via the open drain output while the memory module operates in a first mode, the parity error signal indicating a parity error having occurred in the memory module while the memory module operates in the first mode. The module controller is configured to cause the memory module to enter a second mode in response to a command from the memory controller of the host system. The module controller generates a notification signal indicating at least one status of one or more training sequences while the memory module is in the second mode and outputs the notification signal to the memory controller of the host system via the open drain output while the memory module is in the second mode.

29 Claims, 3 Drawing Sheets

(56) References Cited

U.S. PATENT DOCUMENTS

| | | |
|---|---|---|
| 7,266,633 B2 | 9/2007 | James |
| 7,489,163 B2 | 2/2009 | Goodnow et al. |
| 7,539,909 B2 | 5/2009 | LeClerg et al. |
| 7,586,350 B2 | 9/2009 | Chung et al. |
| 8,429,493 B2 | 4/2013 | Sokolov et al. |
| 2001/0034246 A1* | 10/2001 | Hutchison, IV ....... H04M 11/06 455/557 |
| 2003/0115427 A1 | 6/2003 | Roohparvar |
| 2005/0071580 A1 | 3/2005 | LeClerg et al. |
| 2007/0091702 A1 | 4/2007 | Nikitin |
| 2007/0214347 A1 | 9/2007 | Rothman et al. |
| 2008/0256281 A1 | 10/2008 | Fahr et al. |
| 2009/0119464 A1 | 5/2009 | Grundy |
| 2010/0005218 A1 | 1/2010 | Gower et al. |
| 2010/0042778 A1 | 2/2010 | Grundy et al. |
| 2010/0202240 A1 | 8/2010 | Moshayedi et al. |
| 2011/0022789 A1 | 1/2011 | Fujimoto |

\* cited by examiner

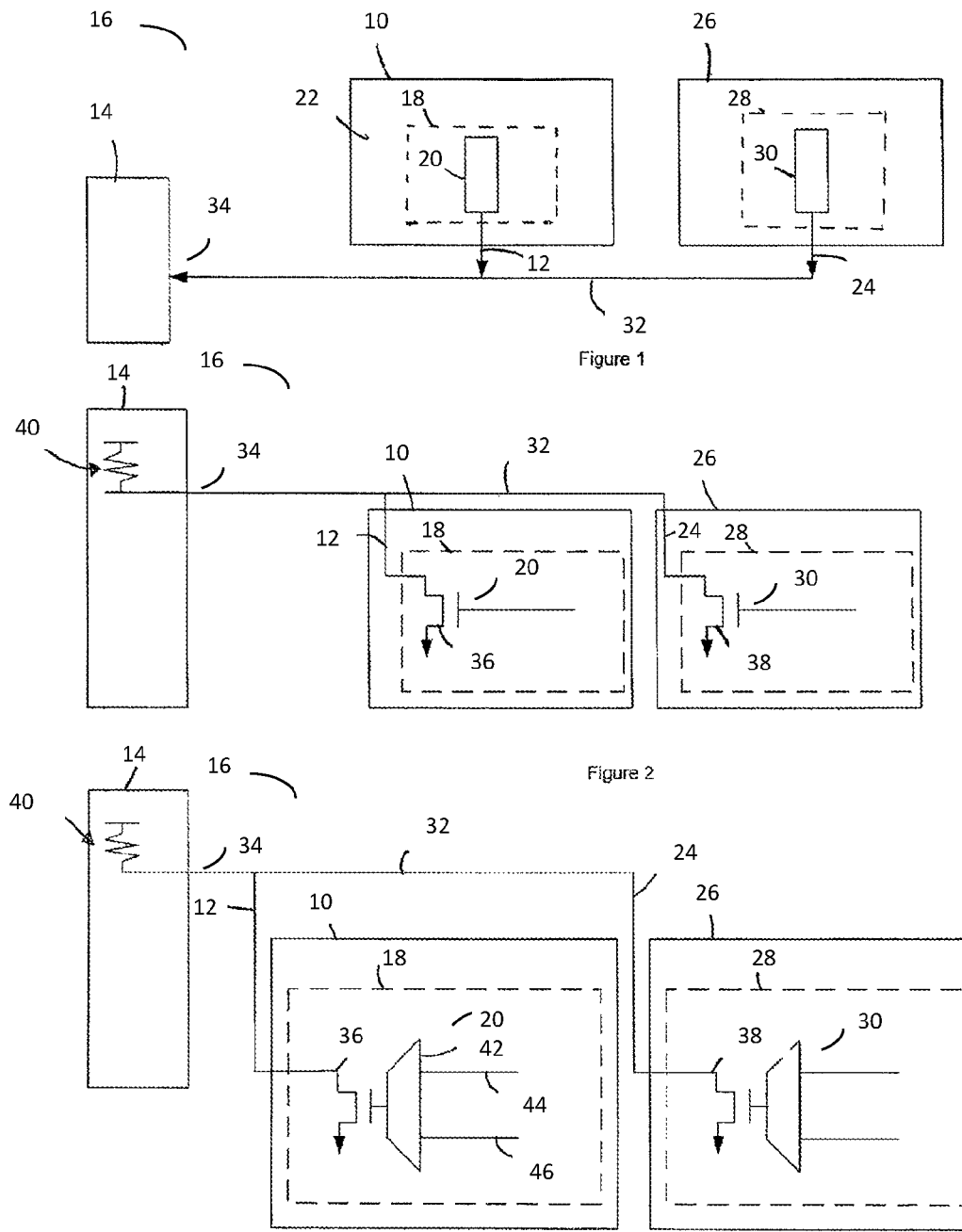

MEMORY MODULE CAPABLE OF HANDSHAKING WITH A MEMORY CONTROLLER OF A HOST SYSTEM

CROSS-REFERENCE TO RELATED APPLICATIONS

This application is a continuation of U.S. application Ser. No. 15/088,115, filed Apr. 1, 2016, entitled "SYSTEMS AND METHODS FOR HANDSHAKING WITH A MEMORY MODULE," which is a continuation of U.S. application Ser. No. 13/942,721, filed Jul. 16, 2013, now U.S. Pat. No. 9,311,116 on Apr. 12, 2016, which is a continuation of U.S. application Ser. No. 12/815,339, filed Jun. 14, 2010, now U.S. Pat. No. 8,489,837, which claims the benefit of priority from U.S. Provisional App. No. 61/186,799, filed Jun. 12, 2009. Each of the above applications/patents is incorporated in its entirety by reference herein.

FIELD OF THE DISCLOSURE

The present disclosure relates to the operation of memory modules. Specifically, the present disclosure relates to a memory module capable of handshaking with a memory controller of a host system.

BACKGROUND OF THE DISCLOSURE

Memory subsystems such as memory modules are generally involved in the initialization procedure for computer systems, including servers, personal computers, and the like. For example, during system-wide initialization, the memory subsystems may undergo internal initialization procedures, or the system memory controller may otherwise interact with the memory subsystems during the initialization procedure. As part of this interaction, the system memory controller may request that the memory subsystem perform one or more requested tasks during system initialization.

SUMMARY

According to certain aspects, a memory module is operable with a memory controller of a host computer system. The memory module includes a module controller having an open drain output. The module controller generates a parity error signal and drives the parity error signal to the memory controller of the host system via the open drain output while the memory module operates in a first mode, the parity error signal indicating a parity error having occurred in the memory module while the memory module operates in the first mode. The module controller is configured to cause the memory module to enter a second mode in response to a command from the memory controller of the host system. The module controller generates a notification signal indicating at least one status of one or more training sequences while the memory module is in the second mode and outputs the notification signal to the memory controller of the host system via the open drain output while the memory module is in the second mode.

The memory module further includes a printed circuit board (PCB) having a first set of edge connections for communicating address and control signals from the memory controller of the host system, a second set of edge connections for communicating data signals between the memory module and the memory controller of the host system while the memory module operates in the first mode, and an error edge connection coupled to the open drain output of the module controller. The memory module communicates to the memory controller of the host system via the error edge connection the parity error signal while the memory module operates in the first mode and the notification signal while the memory module is in the second mode.

In another aspect, a memory module includes a plurality of synchronous dynamic random access memory elements, a printed circuit board (PCB), a module circuit, and a notification circuit. The PCB has a first set of edge connections for communicating address and control signals from the memory controller of the host system, and a second set of edge connections for communicating data signals between the memory module and the memory controller of the host system while the memory module operates in a first mode. The PCB further includes an error edge connection in addition to the first set of edge connections and the second set of edge connections.

In certain embodiments, the module circuit controls the plurality of dynamic random access memory elements in response to read and write commands received from the memory controller of the host system via the first set of edge connections while the memory module operates in the first mode. The module circuit generates a parity error signal indicative of a parity error having occurred in the memory module while the memory module operates in the first mode. The module circuit can cause the memory module to enter a second mode in response to a command from the memory controller of the host system. The module circuit then generates a notification signal in response to one or more training sequences while the memory module is in the second mode, the notification signal indicating a status of the one or more training sequences.

In certain embodiments, the notification circuit has an open drain output coupled to the error edge connection of the PCB. The notification circuit drives the parity error signal to the memory controller of the host system via the open drain output and the error edge connection while the memory module operates in the first mode. The notification circuit drives the notification signal to the memory controller of the host system via the open drain output and the error edge connection while the memory module is in the second mode.

According to additional aspects, a memory module is operable with a memory controller of a host system in at least a first mode and a second mode. The memory module includes a plurality of synchronous dynamic random access memory elements, a PCB, and a module controller. The PCB has a first set of edge connections for communicating address and control signals from the memory controller of the host system, and a second set of edge connections for communicating data signals between the memory module and the memory controller of the host system while the memory module operates in the first mode. The PCB further includes an error edge connection in addition to the first set of edge connections and the second set of edge connections. The PCB is configured to fit into a corresponding slot connector of the host system.

In certain embodiments, the module controller has an open drain output coupled to the error edge connection. The module controller is configured to transmit address and control signals to the plurality of synchronous dynamic random access memory elements in response to read or write commands received from the memory controller of the host system via the first set of edge connections while the memory module operates in the first mode, to generate a parity error signal indicating a parity error having occurred in the memory module while the memory module is in the first mode, and to transmit the parity error signal to the memory controller of the host system via the open drain output and the error edge connection while the memory module is in the first mode. The module controller is further configured to cause the memory module to enter the second mode in response to a command from the memory controller of the host system, to generate a notification signal indicating a status of one or more training sequences while the memory module is in the second mode, and to transmit the notification signal to the memory controller of the host system via the open drain output and the error edge connection while the memory module is in the second mode.

BRIEF DESCRIPTION OF THE DRAWINGS

FIG. 1 shows an example host computer system including an example memory module configured to perform handshaking with a memory controller of the host computer system according to certain embodiments described herein.

FIG. 2 shows an example host computer system including example first and second memory modules configured to perform handshaking with a system memory controller of the host computer system according to certain embodiments described herein.

FIG. 3 shows a host computer system including example first and second memory modules configured to perform handshaking with a memory controller of the host system, where the notification circuits of the first and second memory modules have another example configuration according to certain embodiments described herein.

DETAILED DESCRIPTION

Figure 4:
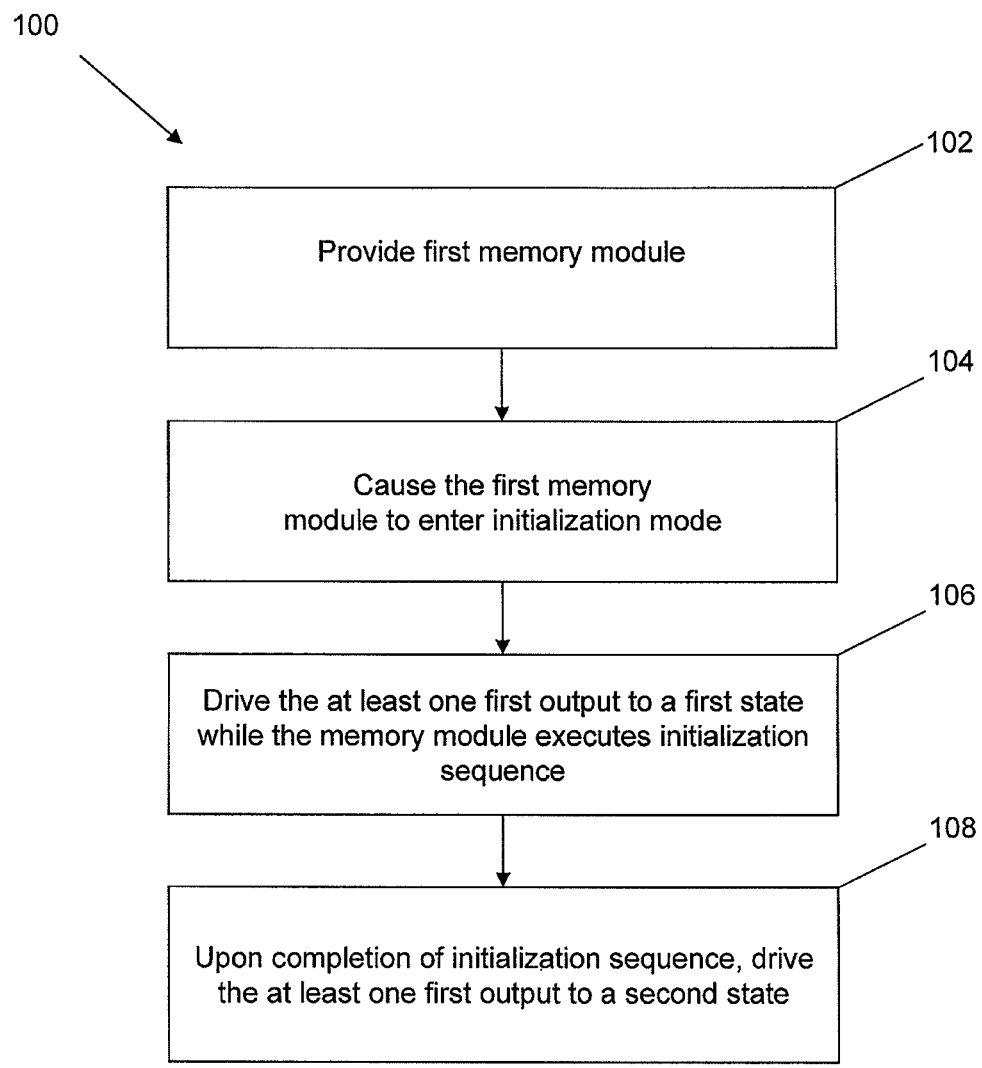
FIG. 4 and FIG. 5 show example methods of using at least one memory module according to certain embodiments described herein.

Existing initialization schemes have certain inefficiencies which lead to wasted time and expense. Thus, there is a need to reduce the time and complexity involved in system memory controller interactions with memory subsystems during initialization. Certain embodiments described herein advantageously satisfy at least a portion of this need by providing a system and method which utilizes a feedback path from a memory subsystem such as a memory module to a system memory controller, such as a Memory Controller Hub (MCH) of a computer system during initialization.

In general, there is no existing method of handshaking between the MCH (e.g., system memory controller) and a memory subsystem (e.g., memory module) during initialization. For example, in conventional systems, the system memory controller does not monitor the error-out signal from the memory subsystem. This causes the MCH to perform blind execution. In a typical server (e.g., an Intel or AMD or other chipset based server), the lack of any handshaking between the MCH and the memory subsystem during the server initialization period has not been a serious issue since the MCH generally has complete control over the initialization procedure. However, one possible configuration for LR-DIMM (Load Reduced DIMM) includes the MCH handing over one or more parts of the initialization operation sequence to the memory subsystem. This raises an unprecedented issue not addressed in conventional systems because, in such proposed configurations, the system can benefit from the MCH handshaking with the memory subsystem controller, as described more fully below.

Such an LR-DIMM configuration may have the MCH inserting a waiting period of predetermined length during which the MCH is idle and the memory subsystem controller undergoes initialization. However, one shortcoming of this LR-DIMM configuration would be that it requires the MCH to be in standby (idle, or wait) while the memory subsystem controller completes its task. Under such an arrangement, since the time to complete a task can be dependent on the density, speed and configuration of the memory subsystem, and these parameters may be unknown to the MCH, the MCH may have to insert a single, predetermined standby period. In addition, if there are multiple occasions that the MCH needs to hand off control to the memory subsystem controller, the required MCH wait periods can be different from one occasion to another, and it complicates the correlation between the MCH and the memory subsystem controller. For example, the MCH according to such a scheme may give control to the local memory controller of a memory subsystem (e.g., memory module) for execution of a training sequence. The MCH may wait for a pre-determined period of time and then assume that the local memory controller has completed the training sequence. However, depending on the memory subsystem parameters (e.g., memory capacity, speed, number of ranks, etc.), the time for actually completing the training sequence may vary and may be longer or shorter than predetermined period of time.

In general, handshaking can be implemented in at least two ways; polling and notifying. In the polling method, the MCH reads a status register in the memory subsystem controller to find out if the memory subsystem controller has completed the required or requested operation. For example, a status register may be read out through a serial interface such as System Management Bus (SMBus). However, a register polling method is generally inefficient because the system memory controller does not know exactly when the memory subsystem will have completed the required or requested operation. Thus, the system memory controller may wait longer than necessary to poll the memory subsystem, thereby delaying the overall initialization process. Additionally, the problem may be compounded because multiple training sequences or other initialization sequences may be run on the memory subsystem during a particular initialization period, resulting in accumulation of such unnecessary delays. Moreover, polling generally involves scheduling polling intervals during which the system memory controller is not performing other operations, resulting in further inefficiency.

Alternatively, the notifying method is an advantageous handshaking method between the MCH and the memory subsystem controller. According to a notifying method, the memory subsystem controller sends a signal to the MCH when the memory subsystem controller completes the required or requested operation. This method allows the MCH to execute one or more independent commands while it is waiting for a notification signal from the memory sub system controller.

Certain embodiments described herein provide a method of establishing a handshake mechanism based on notification signaling. In certain embodiments, this mechanism can be implemented by adding a new interface (notifying) signal between the MCH and the memory subsystem controller, or by adding an additional functionality to an existing, non-timing critical signal without altering the memory subsystem hardware. In either case, the interface between the MCH and the memory subsystem controller of certain embodiments can be an open drain signaling from the memory subsystem controller to the MCH, although a variety of other configurations are possible. As will be appreciated by persons skilled in the art, the terms MCH, system memory controller, and memory subsystem are used generally interchangeable throughout this disclosure, and the terms memory module, memory subsystem controller, and local memory controller are used generally interchangeably throughout this disclosure.

FIG. 1 illustrates an example host computer system 16 including an example memory module 10 according to certain embodiments described herein. The memory module 10 can comprise at least one output 12 configured to be operatively coupled to a system memory controller 14 of the host computer system 16. In certain embodiments, the memory module 10 is configured to operate in at least two modes comprising an initialization mode during which the memory module 10 executes at least one initialization sequence, and an operational mode. The memory module 10 may further include a controller circuit 18. In some embodiments, the controller circuit 18 is configured to cause the memory module 10 to enter the initialization mode. The memory module 10 can further include a notification circuit 20 configured to drive the at least one output 12 while the memory module 10 is in the initialization mode to provide at least one notification signal to the memory controller 14 indicating at least one status of the at least one initialization sequence.

The memory module 10 may comprise a printed-circuit board (PCB) 22. In certain embodiments, the memory module 10 has a memory capacity of 512-MB, 1-GB, 2-GB, 4-GB, 8-GB, 16-GB, or higher. Other memory capacities are also compatible with certain embodiments described herein. In addition, memory modules 10 having widths of 4 bytes, 8 bytes, 16 bytes, 32 bytes, or 32 bits, 64 bits, 128 bits, 256 bits, as well as other widths (in bytes or in bits), are compatible with embodiments described herein. The PCB 22 can have an industry-standard form factor. For example, the PCB 22 can have a low profile (LP) form factor with a height of 30 millimeters and a width of 133.35 millimeters. In certain other embodiments, the PCB 20 has a very high profile (VHP) form factor with a height of 50 millimeters or more. In certain other embodiments, the PCB 22 has a very low profile (VLP) form factor with a height of 18.3 millimeters. Other form factors including, but not limited to, small-outline (SO-DIMM), unbuffered (UDIMM), registered (RDIMM), fully-buffered (FBDIMM), mini-DIMM, mini-RDIMM, VLP mini-DIMM, micro-DIMM, and SRAM DIMM are also compatible with certain embodiments described herein. In other embodiments, certain non-DIMM form factors are possible such as, for example, single in-line memory module (SIMM), multi-media card (MMC), and small computer system interface (SCSI).

In certain embodiments, the memory module 10 is operatively coupled to (e.g., in electrical communication with) the host computer system 16. In certain other embodiments, the memory module 10 may communicate with the host computer system 16 using some other type of communication, such as, for example, optical communication. Examples of host computer systems 16 include, but are not limited to, blade servers, 1U servers, personal computers (PCs), and other applications in which space is constrained or limited. The PCB 22 can comprise an interface (not shown) that is configured to be in electrical communication with the host computer system 16. For example, the interface can comprise a plurality of edge connections which fit into a corresponding slot connector of the host system 16. The interface of certain embodiments provides a conduit for power voltage as well as data, address, and control signals between the memory module 10 and the host system 16. For example, the interface can comprise a standard 240-pin DDR2 edge connector. The at least one output 12 may be routed over the interface, for example.

The memory module 10 may also comprise one or more memory elements (not shown), such as dynamic random-access memory (DRAM) elements, for example. Types of DRAM elements compatible with certain embodiments described herein include, but are not limited to, DDR, DDR2, DDR3, DDR4, and synchronous DRAM (SDRAM). In addition, memory elements having bit widths of 4, 8, 16, 32, as well as other bit widths, are compatible with certain embodiments described herein. Memory elements compatible with certain embodiments described herein have packaging which include, but are not limited to, thin small-outline package (TSOP), ball-grid-array (BGA), fine-pitch BGA (FBGA), micro-BGA (pBGA), mini-BGA (mBGA), and chip-scale packaging (CSP). In certain embodiments, the memory module 10 may also include one or more non-volatile memory elements, such as one or more flash memory elements. Types of flash memory elements compatible with certain embodiments described herein include, but are not limited to, NOR flash, NAND flash, ONE-NAND flash, and multi-level cell (MLC).

The controller circuit 18 of certain embodiments generally controls the operation of the memory module 10. For example, the controller circuit 18 may control the memory elements of the memory module 10 and/or communicate with the system memory controller 14. For example, the controller circuit 18 may receive and process address and command signals (e.g., read, write commands) from the system memory controller 14 and transmit appropriate address and commands to the memory elements in response. See, e.g., U.S. Pat. Appl. Publ. Nos. 2006/0062047 A1 and 2006/0262586 A1, each of which is incorporated in its entirety by reference herein. In certain embodiments, the controller circuit 18 comprises a local memory controller. Additionally, depending on the architecture of the memory module 10, such as for an FB-DIMM, the controller circuit 18 may comprise an advanced memory buffer (AMB). The controller circuit 18 can comprise one or more of a field-programmable gate array (FPGA), a programmable-logic device (PLD), an application-specific integrated circuit (ASIC), a custom-designed semiconductor device, and a complex programmable logic device (CPLD), for example. In certain embodiments, the controller circuit 18 comprises various discrete electrical elements, while in certain other embodiments, the controller circuit 18 comprises one or more integrated circuits.

As discussed, the memory module 10 is configured to operate in at least two modes comprising an initialization mode during which the memory module 10 executes at least one initialization sequence, and an operational mode. In one embodiment, for example, the at least one initialization sequence may comprise one or more training sequences. The initialization sequence (e.g., comprising one or more training sequences) may be initiated by the system memory controller 14. In some embodiments, the controller circuit 18 is configured to cause the memory module 10 to enter the initialization mode. For example, the controller circuit 18 may be configured to execute a routine implementing the at least one initialization sequence when the appropriate signal or command is received from the memory controller 14 or is otherwise received from the host computer system 16 (e.g., upon receipt of a reset signal).

In certain embodiments, for example, the computer system 16 is coupled to a plurality of memory modules 10, 26 including the memory module 10 and at least a second memory module 26, and the memory controller 14 (e.g., MCH) trains each module 10, 26 separately, in series. In one example scenario, the memory controller 14 issues a first command to the memory module 10, and, in response, the memory module 10 executes an initialization sequence (e.g., one or more training sequences). Upon completion of the initialization sequence, the first memory module 10 advantageously issues a notification to the memory controller 14 in accordance with embodiments described herein. In response, the memory controller 14 issues a second command, this time to the memory module 26, and, in response, the memory module 26 executes an initialization sequence (e.g., one or more training sequences). Upon completion of the initialization sequence, the second memory module 26, similar to the first memory module 10, advantageously issues a notification to the memory controller 14 in accordance with embodiments described herein. In response, where there are more than two memory modules 10, 26, the memory controller 14 issues a third command to a third memory module (not shown), and so forth. One example computer system 16 capable of implementing such a scenario is configured to execute an Intel Basic Input/Output System (BIOS), and comprises a plurality of memory modules 10, 26 having an LRDIMM configuration. In such an example system, the Intel BIOS causes the system memory controller 14 to initialize the LRDIMM memory modules 10, 26 serially.

The operational mode is the normal mode of the memory module 10. For example, during the operational mode, the memory module 10 is generally accessed by the system memory controller 14 of the host computer 16 during standard computer operation not associated with initialization. For example, the system memory controller 14 may cause the memory module 10 to perform standard operations such as memory read/write, pre-charge, refresh, etc., while in operational mode, although it will be appreciated that one or more of these operations can also be performed by the memory module 10 while in initialization mode in certain embodiments.

The notification circuit 20 can be configured to drive the at least one output 12, while the memory module 10 is in the initialization mode or after the memory module 10 completes one or more initialization sequences, to provide the at least one notification signal to the memory controller 14 indicating at least one status of the at least one initialization sequence. While shown in FIGS. 1-3 as forming a part of the controller circuit 18, the notification circuit 20 may be a physically and/or logically separate circuit in certain embodiments. While a variety of configurations are possible, the notification circuit 20 may comprise one or more transistors, one or more logic elements (e.g., AND, OR, NOR, NAND, XOR gates, and the like), or a combination thereof. In some embodiments, the notification circuit 20 may additionally or alternatively comprise one or more of an FPGA, PLD, CPLD, ASIC, custom-designed semiconductor device, discrete electrical elements, and an integrated circuit.

The at least one status of certain embodiments comprises completion of the at least one initialization sequence, such that the at least one notification signal is indicative of the completion of the at least one initialization sequence. The at least one status of certain embodiments comprises execution of the at least one initialization sequence. For example, the at least one status may indicate that the at least one initialization sequence is currently being executed. In some embodiments, the at least one status may provide an indication that a certain task has been completed by the memory module 10, such as a training task requested by the system memory controller 14. In certain embodiments, the notification circuit 20 can be configured to drive the at least one output 12 to a first state indicative of execution of the at least one initialization sequence or to a second state indicative of completion of the at least one initialization sequence. As one example, the first state may be a high or low logic level, and the second state may be a high impedance state. In another case, the first state is a high or low logic level, and the second state is the inverse logic level of the first state.

The at least one output 12 of certain embodiments is configured to be operatively coupled to at least one interrupt of the system memory controller 14, and the system memory controller 14 is responsive to the at least one notification signal indicating completion of the at least one initialization sequence. For example, the system memory controller 14 may trigger execution of an interrupt routine upon receipt of the notification signal on the output 12. The interrupt routine generally executes the appropriate operations for the at least one status indicated by the at least one notification signal. For example, if the at least one status indicates that the at least one initialization sequence is complete, execution of the interrupt routine may cause the system memory controller 14 to notify the host computer system 16 that the system initialization, or a portion thereof, is completed. In one embodiment, for example, the execution of the interrupt routine causes the system memory controller 14 to initiate a subsequent training sequence for the memory module 10 or on another memory module connected to the host system 16. For example, in one embodiment, a central processing unit (CPU) of the host system 16 (not shown) enters a "Wait" state after issuing a command to the memory module 10 to enter the initialization mode. Receipt of the at least one notification signal on the output 12 triggers execution of the interrupt routine, which interrupts the CPU, causing the "Wait" state to be aborted and allowing the host system 16 to continue operation. In this manner, generation of the interrupt on the at least one output 12 can allow completion of the at least one initialization sequence to receive generally immediate attention from the CPU and/or memory controller 14 of the host system 16. As will be appreciated, the CPU and memory controller 14 of the host system 16 may comprise separate modules, or may alternatively comprise a single integrated module, depending on the architecture of the host system 16 chip-set.

In certain embodiments, execution of the interrupt routine causes the system memory controller 14 to cause the memory module 10 to exit the initialization mode and to enter the operational mode. In another embodiment, the memory module 10 automatically enters the operational mode upon completion of the at least one initialization sequence without intervention from the memory controller 14.

In some embodiments, the at least one output 12 is operated in conformance with a standard (e.g., an industry standard) when the memory module 10 is in the operational mode, but is not operated in conformance with the standard when the memory module 10 is in the initialization mode. An example of a standard in accordance with certain embodiments described herein is one or more of the industry standard promulgated by the Joint Electronic Devices Engineering Counsel (JEDEC). For example, the operation and behavior of the at least one output 12 may conform to an industry standard when the memory module 10 is in the operational mode, but the operation and behavior of the at least one output 12 may not conform to the industry standard when the memory module 10 is in the initialization mode.

Because the at least one output 12 does not conform to the standard during initialization mode, an existing (e.g., JEDEC-specified) pin may be utilized to provide the at least one notification signal to the system memory controller 14 from the memory module 10 during the initialization mode. In one embodiment, for example, the at least one output 12 comprises an error-out pin of the memory module 10. In conventional systems, the operation of the error-out pin is undefined by the standard during initialization. However, in certain embodiments described herein, during the operational mode, the error-out pin may be used according a conventional industry standard (e.g., a JEDEC standard) to indicate a parity error has occurred in the memory module 10. During the initialization mode, the error-out pin can be used to transmit the at least one notification signal to the system memory controller 14.

It is advantageous to use the error-out pin for initialization status notification according to certain embodiments because the error-out pin can be asserted by the memory module 10 independent from system memory controller 14 requests or commands. Also, because the error-out pin is a JEDEC-specified pin, design cost and complexity are reduced because additional pin-outs and interrupt design changes can be avoided (e.g., in cases where such changes in hardware or chipset may not be feasible to provide the at least one status to the system memory controller 14). However, in certain other embodiments, providing the at least one status may be implemented by adding one or more pins to the system memory controller 14 (e.g., MCH) and to the controller circuit 18 (e.g., local memory controller), thereby utilizing changes in hardware or the chipset.

Moreover, the error-out pin may be coupled to an interrupt of the system memory controller 14 (e.g., according to the JEDEC standard). Thus, where the error-out pin is used, from the system point of view in accordance with certain embodiments, the notification of completion of the required or requested task from the memory module 10 (e.g., by the local memory controller) generates an interrupt communicated to the system during the initialization period and indicative of completion of the required or requested task. Assertion of the same pin during normal (non-initialization) operation upon an error occurring, on the other hand, generates an interrupt communicated to the system during the normal operation indicative of the occurrence of the error condition. Thus, in certain embodiments, the error-out pin and corresponding signal memory module 10 can be used to support the notifying function and to provide the at least one status generally without changing hardware. Certain other such embodiments involve modifying the basic input/output system (BIOS) or other programming change. For example, the BIOS may be modified to indicate to the system memory controller 14 how to respond to the notification signal (e.g., to the error_out signal or the interrupt corresponding thereto).

In certain other embodiments, the at least one output 12 may include other existing (e.g., JEDEC specified) pins instead of, or in addition to, the error-out pin. In yet other configurations, at least one additional (e.g., non-JEDEC specified) pin may be employed. In general, any pin not otherwise active during the initialization mode may be used (e.g., high-order address pins, read/write pins, data pins, etc.).

The at least one output 12 can further be configured to be operatively coupled to at least one second output 24 of a second memory module 26 in some embodiments, as schematically illustrated in FIGS. 1-3. The second memory module 26 may be generally similar in structure and function to the memory module 10, and may comprise a controller circuit 28 and a notification circuit 30, for example. The second memory module 26 may be generally identical to the first memory module 10, or may have a different memory capacity, form factor, etc., than the first memory module 10. More than two such memory modules may be present in certain embodiments. As described above, the second memory module 26 can be configured to operate in at least two modes comprising an initialization mode during which the second memory module 26 executes at least one initialization sequence, and an operational mode. For example, the initialization and operational modes may be similar to those describe above in relation to the first memory module 10.

The second memory module 26 can also be configured to drive the at least one second output 24 to a third state indicative of execution of at least one initialization sequence of the second memory module 26 or to a fourth state indicative of completion of the at least one initialization sequence of the second memory module 26. Additionally, in some embodiments, the at least one first output 12 of the first memory module 10 and the at least one second output 24 of the second memory module 26 are operatively coupled together by a bus 32 which is also operatively coupled to at least one input 34 of the system memory controller 14. In other embodiments (not shown), the at least one first output 12 and the at least one second output 24 are not coupled together, and are coupled to two separate inputs of the system memory controller 14.

FIG. 2 shows an example host computer system 16 including example first and second memory modules 10, 26. As shown, the notification circuits 20, 30 of the first and second memory modules 10, 26 each comprise at least one transistor 36, 38. The at least one transistor 36, 38 can be in an open-drain configuration, as shown, although other configurations are possible. In certain such embodiments, the first state of the at least one first output 12 is a first logic level, the second state of the at least one first output 12 is a high-impedance state, the third state of the at least one second output 24 is the first logic level, and the fourth state of the at least one second output 24 is the high-impedance state. In the illustrated example, while the at least one initialization sequence is in progress, the first and second memory modules 10, 26 drive the gates of the respective transistors 36, 38 high. Thus, the transistors 36, 38 are respectively low impedance while the memory modules 10, 26 are executing each section of the initialization sequence, thereby pulling the first and second outputs 12, 24 low. Thus, the first state and the third state are low logic levels (ground) in the example configuration. Also, because the first and second outputs 12, 24 are coupled together by the bus 32, if the at least one initialization sequence of either one of the first and second memory modules 10, 26 are in progress, the bus 32 will be pulled to a low logic level.

As each of the two memory modules 10, 26 completes its at least one initialization sequence, it can drive the corresponding at least one first and second outputs 12, 24 respectively to a high impedance state, For example, once the at least one initialization sequence on each of the first and second memory modules 10, 26 is completed, the first and second memory modules 10, 26 can drive the gates of the respective transistors 36, 38 low, resulting in a high-impedance state on the at least one first and second outputs 12, 24 causing the bus 32 to be pulled high by the system memory controller 14. Accordingly, only once the at least one initialization sequence of both the first and second memory modules 10, 26 are complete, the bus 32 will be pulled high by the internal pull-up configuration 40 of the system memory controller 14. The second state and the fourth state are therefore high-impedance values in the example embodiment. Thus, the system memory controller 14 can monitor the value on the bus 32 via the first input 34 to determine when both of the memory modules 10, 26 have completed the at least one initialization sequence. As discussed, in other configurations the at least one first and second outputs 12, 24 may be received on separate inputs of the system memory controller 14, and the status of the at least one initialization sequence of each memory module 10, 26 may be monitored independently.

As discussed above, in certain embodiments in which more than one memory module 10, 26 is connected to the system memory controller 14, each memory module 10, 26 or associated controller circuit 18 (e.g., local memory controller) causes the corresponding notification circuit 20, 30 to drive the at least one output 12, 24 to the high impedance state from the low impedance state when it completes the requested or required operation. Thus, in certain such embodiments, the system memory controller 14 (e.g., MCH) can only pull the notifying signal high when all memory modules 10, 26 or associated controller circuits (e.g., local memory controllers) have completed the required or requested operation (e.g., initialization sequence). This configuration allows the system memory controller 14 (e.g., MCH) to work with a non-homogenous memory subsystem. For example, the system memory controller 14 may be able to monitor the progress of multiple memory modules 10, 26 including a mix of DIMMs or other memory modules having differing characteristics, such as DIMM density, rank configurations, DRAM density, speed, DRAM configuration, etc.

Additionally, the at least one output 12 of the first memory module 10 and the at least one second output 24 of the second memory module 26 are configured to be operatively coupled to at least one interrupt of the system memory controller 14 in certain embodiments. In certain such embodiments, the system memory controller 14 can be responsive to the second state of the first memory module 10 and the fourth state of the second memory module 26 by triggering execution of an interrupt routine by a processor of the system memory controller 14. For example, in the example system of FIG. 2, when the bus 32 is pulled high by the pull-up configuration 40 indicating the second state of the first memory module 10 and the fourth state of the second memory module 26, the system memory controller 14 triggers execution of the interrupt routine.

In some embodiments, in which the at least one first output 12 and the at least one second output 24 are operatively coupled to separate inputs of the system memory controller 14, the at least one first output 12 and the at least out second output 24 may be operatively coupled to two separate interrupts. For example, the system memory controller 14 may be responsive to the second state of the first memory module 10 by triggering execution of a first interrupt routine associated with a first interrupt, and may be responsive to the fourth state of the second memory module 26 by triggering execution of a second interrupt routine associated with the second interrupt. In yet other embodiments, the separate inputs of the memory controller 14 are internally operatively coupled to the same interrupt, or are operatively coupled to separate interrupts which trigger the same interrupt routine.

FIG. 3 shows a host computer system 16 including an example memory module 10 where the notification circuit 20 of the memory module 10 has another example configuration in accordance with certain embodiments described herein. In the example configuration of FIG. 3, the at least one first output 12 is operatively coupled to an error-out pin of the memory module 10, and a multiplexor 42 drives the transistor 36 with either of a task_in_progress signal 44 or an error signal 46 (e.g., parity error signal). In one embodiment, for example, the multiplexor 42 may be configured to drive the transistor 36 with the task_in_progress signal 44 when the memory module 10 is in the initialization mode or is executing the at least one initialization sequence, and with the error signal 46 when the memory module 10 is in the operational mode. Thus, the memory module 10 can be advantageously configured to both perform the standard (e.g., JEDEC-specified) error reporting functionality via the error-out pin during the operational mode and provide the status notification functionality during the system initialization mode, as described herein. As shown in FIG. 3, a second memory module 26 including a similar configuration can also be operatively coupled to the host computer system 16. In certain embodiments, the at least one second output 24 of the second memory module 26 can be operatively coupled to the at least one first output 12 by the bus 32, as described above (e.g., with respect to FIG. 2).

FIG. 4 shows an example method 100 of using the at least one memory module 10 in accordance with certain embodiments described herein. While the description below of the method 100 refers to structure shown in FIGS. 1-3, other structures may also be used in accordance with certain embodiments described herein. At block 102, the method 100 of certain embodiments comprises providing a first memory module 10 comprising at least one first output 12 operatively coupled to a memory controller 14 of a host computer system 16. The first memory module 10 can be configured to operate in at least two modes comprising an initialization mode during which the first memory module 10 executes at least one initialization sequence, and an operational mode. For example, the at least one initialization sequence may comprise one or more steps of a series of steps associated with an initialization procedure of the host computer system 16.

At block 104, the method 100 in some embodiments comprises causing the first memory module 10 to enter the initialization mode. At block 106, the method 100 of certain embodiments comprises driving the at least one first output 12 to a first state while the memory module 10 executes the at least one initialization sequence. Upon completion of the at least one initialization sequence, the method of certain embodiments comprises driving the at least one first output 12 to a second state different than the first state. In certain embodiments, the first state is a first logic level and the second state is a high impedance state. Additionally, in certain embodiments, the at least one first output 12 is operatively coupled to at least one interrupt of the memory controller 14 such that driving the at least one output 12 to the second state triggers the memory controller to execute an interrupt routine.

In certain embodiments, the at least one output 12 is operated in conformance with JEDEC standard when the first memory module 10 is in the operational mode, but is not operated in conformance with the JEDEC standard when the first memory module 10 is in the initialization mode. The at least one first output 12 of certain embodiments include an error-out pin of the first memory module 10, for example.

The method 100 can further include providing a second memory module 26 comprising at least one second output 24 operatively coupled to the memory controller 14. The second memory module 26 can be configured to operate in one of at least two modes comprising an initialization mode, during which the second memory module 26 executes at least one initialization sequence, and an operational mode. The method 100 can further include causing the second memory module 26 to enter the initialization mode. In certain embodiments, the method 100 also includes driving the at least one second output 24 of the second memory module 26 to a third state while the second memory module 26 executes the at least one initialization sequence. Upon completion of the at least one initialization sequence, the method 100 can further include driving the at least one second output 24 of the second memory module 26 to a fourth state different from the third state.

In certain embodiments, the at least one first output 12 of the first memory module 10 and the at least one second output 24 of the second memory module 26 are operatively coupled together by a bus 32 which is also operatively coupled to at least one input 34 of the memory controller 14. In certain other embodiments, the at least one first output 12 of the first memory module 10 is operatively coupled to a first input 34 of the memory controller 14 and the at least one second output 24 of the second memory module 26 is operatively coupled to a second input (not shown) of the memory controller 14.

Figure 5:
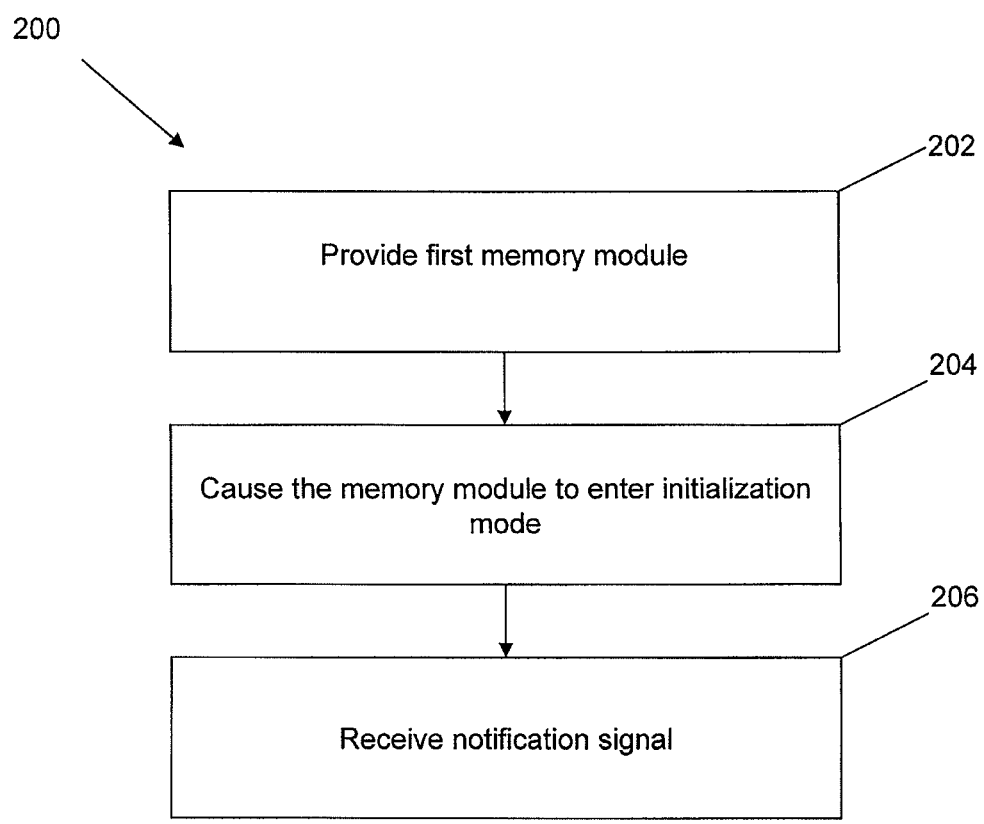

FIG. 5 shows another example method 200 of using at least one memory module 10 in accordance with certain embodiments described herein. At block 202, the method 200 may include providing a memory module 10 comprising at least one output 12 operatively coupled to a memory controller 14 of a host computer system 16. The memory module 10 may be configured to operate in at least two modes comprising an initialization mode, during which the memory module 10 executes at least one initialization sequence, and an operational mode.

The method 200 can further include causing the memory module 10 to enter the initialization mode at block 204. At block 206, the method 200 can include receiving a notification signal from the at least one output 12 of the memory module 10. The notification signal may indicate that the memory module 10 has completed the initialization sequence, for example. In certain embodiments, the method 200 further comprises executing an interrupt routine by the memory controller 14 in response to the notification signal.

Terminology/Alternative Embodiments

Embodiments have been described in connection with the accompanying drawings. However, it should be understood that the figures are not drawn to scale. Distances, angles, etc. are merely illustrative and do not necessarily bear an exact relationship to actual dimensions and layout of the devices illustrated. In addition, the foregoing embodiments have been described at a level of detail to allow one of ordinary skill in the art to make and use the devices, systems, etc. described herein. A wide variety of variation is possible. Components, elements, and/or steps can be altered, added, removed, or rearranged. While certain embodiments have been explicitly described, other embodiments will become apparent to those of ordinary skill in the art based on this disclosure.

Conditional language used herein, such as, among others, "can," "could," "might," "may," "e.g.," and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

Depending on the embodiment, certain acts, events, or functions of any of the methods described herein can be performed in a different sequence, can be added, merged, or left out all together (e.g., not all described acts or events are necessary for the practice of the method). Moreover, in certain embodiments, acts or events can be performed concurrently, e.g., through multi-threaded processing, interrupt processing, or multiple processors or processor cores, rather than sequentially.

The various illustrative logical blocks, modules, circuits, and algorithm steps described in connection with the embodiments disclosed herein can be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. The described functionality can be implemented in varying ways for each particular application, but such implementation decisions should not be interpreted as causing a departure from the scope of the disclosure.

The various illustrative logical blocks, modules, and circuits described in connection with the embodiments disclosed herein can be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor can be a microprocessor, but in the alternative, the processor can be any conventional processor, controller, microcontroller, or state machine. A processor can also be implemented as a combination of computing devices, e.g., a combination of a DSP and a microprocessor, a plurality of microprocessors, one or more microprocessors in conjunction with a DSP core, or any other such configuration.

The blocks of the methods and algorithms described in connection with the embodiments disclosed herein can be embodied directly in hardware, in a software module executed by a processor, or in a combination of the two. A software module can reside in RAM memory, flash memory, ROM memory, EPROM memory, EEPROM memory, registers, a hard disk, a removable disk, a CD-ROM, or any other form of computer-readable storage medium known in the art. An exemplary storage medium is coupled to a processor such that the processor can read information from, and write information to, the storage medium. In the alternative, the storage medium can be integral to the processor. The processor and the storage medium can reside in an ASIC. The ASIC can reside in a user terminal. In the alternative, the processor and the storage medium can reside as discrete components in a user terminal.

Certain embodiments described herein are compatible with a memory system including memory devices with various attributes (see, e.g., FIGS. 2 and 3). For example, the memory system of certain embodiments may include various data slice sizes (e.g., two, four, eight, or 16 bit data slices) and corresponding memories (e.g., memories having two, four, eight, or 16 bit data widths).

Although certain embodiments and examples are discussed above, it is understood that the inventive subject matter extends beyond the specifically disclosed embodiments to other alternative embodiments and/or uses of the invention and obvious modifications and equivalents thereof. It is intended that the scope of the inventions disclosed herein should not be limited by the particular disclosed embodiments. Thus, for example, in any method or process disclosed herein, the acts or operations making up the method/process may be performed in any suitable sequence and are not necessarily limited to any particular disclosed sequence.

Various aspects and advantages of the embodiments have been described where appropriate. It is to be understood that not necessarily all such aspects or advantages may be achieved in accordance with any particular embodiment. Thus, for example, it should be recognized that the various embodiments may be carried out in a manner that achieves or optimizes one advantage or group of advantages as taught herein without necessarily achieving other aspects or advantages as may be taught or suggested herein.

What is claimed is:

1. A memory module configured to fit into a corresponding slot of a host system to operate with a memory controller of the host system, the memory module comprising:
    a module controller having an open drain output, the module controller generating a parity error signal and driving the parity error signal to the memory controller of the host system via the open drain output while the memory module operates in a first mode, the parity error signal indicating a parity error having occurred in the memory module while the memory module operates in the first mode, wherein the module controller is configured to cause the memory module to enter a second mode in response to a command from the memory controller of the host system, the module controller generating a notification signal indicating at least one status of one or more training sequences while the memory module is in the second mode and outputting the notification signal to the memory controller of the host system via the open drain output while the memory module is in the second mode; and
    a printed circuit board having a first set of edge connections for communicating address and control signals from the memory controller of the host system, a second set of edge connections for communicating data signals between the memory module and the memory controller of the host system while the memory module operates in the first mode, and an error edge connection coupled to the open drain output of the module controller, the memory module communicating to the memory controller of the host system via the error edge connection the parity error signal while the memory module operates in the first mode and the notification signal while the memory module is in the second mode.

2. The memory module of claim 1, further comprising:
    a plurality of synchronous dynamic random access memory elements, wherein, while the memory module is in the first mode, the module controller receives and processes address and control signals corresponding to read or write commands from the memory controller of the host system and transmits processed address and control signals to the plurality of synchronous dynamic random access memory elements.

3. The memory module of claim 1, wherein, while the memory module is in the second mode, the module controller drives the notification signal to a logic low level via the open drain output to indicate a status of the one or more training sequences.

4. The memory module of claim 1, wherein the first mode is an operational mode of the memory module, and the second mode is a training mode of the memory module.

5. The memory module of claim 1, wherein the one or more training sequences are executed by the module controller in response to a command or a signal received from the memory controller of the host system.

6. The memory module of claim 1, wherein the module controller comprises one or more integrated circuit.

7. The memory module of claim 1, wherein the module controller includes a notification circuit comprising one or more transistors each having an open drain coupled to the open drain output.

8. The memory module of claim 7, wherein the notification circuit generates the notification signal by driving a gate of each of the one or more transistors to a logic high level such that the open drain of each of the one or more transistors provides a low impedance path to ground.

9. The memory module of claim 7, wherein the notification circuit generates the parity error signal by driving a gate of each of the one or more transistors to a logic high level such that the open drain of each of the one or more transistors provides a low impedance path to ground.

10. The memory module of claim 7, wherein the notification circuit generates the notification signal using one or more OR logic elements.

11. The memory module of claim 1, wherein the module controller implements the one or more training sequences in response to a signal or a command received from the memory controller of the host system.

12. A memory module to be coupled to a memory controller of a host system, the memory module comprising:
    a plurality of synchronous dynamic random access memory elements;
    a printed circuit board (PCB) having a first set of edge connections for communicating address and control signals from the memory controller of the host system, and a second set of edge connections for communicating data signals between the memory module and the memory controller of the host system while the memory module operates in a first mode, the PCB further including an error edge connection in addition to the first set of edge connections and the second set of edge connections;
    a module circuit controlling the plurality of synchronous dynamic random access memory elements in response to read and write commands received from the memory controller of the host system via the first set of edge connections while the memory module operates in the first mode, the module circuit generating a parity error signal indicative of a parity error having occurred in the memory module while the memory module operates in the first mode, the module circuit causing the memory module to enter a second mode in response to a command from the memory controller of the host system, the module circuit generating a notification signal in response to one or more training sequences while the memory module is in the second mode, the notification signal indicating a status of the one or more training sequences; and
    a notification circuit having an open drain output coupled to the error edge connection of the PCB, the notification circuit driving the parity error signal to the memory controller of the host system via the open drain output and the error edge connection while the memory module operates in the first mode, the notification circuit driving the notification signal to the memory controller of the host system via the open drain output and the error edge connection while the memory module is in the second mode.

13. The memory module of claim 12, wherein the memory module executes the one or more training sequences in response to a signal or a command from the memory controller of the host system.

14. The memory module of claim 12, wherein the first mode is an operational mode of the memory module, and the second mode is a training mode of the memory module.

15. The memory module of claim 12, wherein the notification circuit generates the notification signal using one or more OR logic elements.

16. The memory module of claim 12, wherein the notification circuit is a physically separate circuit from the module circuit.

17. The memory module of claim 12, wherein the module circuit includes the notification circuit.

18. The memory module of claim 12, wherein the notification circuit includes one or more transistors each having an open drain coupled to the open drain output.

19. The memory module of claim 18, wherein the notification circuit generates the notification signal by driving a gate of each of the one or more transistors to a logic high level such that the open drain of each of the one or more transistors provides a low impedance path to ground.

20. The memory module of claim 18, wherein the notification circuit generates the parity error signal by driving a gate of each of the one or more transistors to a logic high level such that the open drain of each of the one or more transistors provides a low impedance path to ground.

21. A memory module operable in at least a first mode and a second mode, the memory module comprising:
  a plurality of synchronous dynamic random access memory elements;
  a printed circuit board (PCB) having a first set of edge connections for communicating address and control signals from the memory controller of the host system, and a second set of edge connections for communicating data signals between the memory module and the memory controller of the host system while the memory module operates in the first mode, the PCB further including an error edge connection in addition to the first set of edge connections and the second set of edge connections, wherein the PCB is configured to fit into a corresponding slot connector of the host system; and
  a module controller having an open drain output coupled to the error edge connection, the module controller being configured to transmit address and control signals to the plurality of synchronous dynamic random access memory elements in response to read or write commands received from the memory controller of the host system via the first set of edge connections while the memory module operates in the first mode, to generate a parity error signal indicating a parity error having occurred in the memory module while the memory module is in the first mode, and to transmit the parity error signal to the memory controller of the host system via the open drain output and the error edge connection while the memory module is in the first mode, the module controller being further configured to cause the memory module to enter the second mode in response to a command from the memory controller of the host system, to generate a notification signal indicating a status of one or more training sequences while the memory module is in the second mode, and to transmit the notification signal to the memory controller of the host system via the open drain output and the error edge connection while the memory module is in the second mode.

22. The memory module of claim 21, wherein the first mode is an operational mode of the memory module, and the second mode is a training mode of the memory module.

23. The memory module of claim 21, wherein the memory module executes the one or more training sequences in response to a command or a signal received from the memory controller of the host system.

24. The memory module of claim 21, wherein the module controller includes a notification circuit comprising one or more transistors, each of the one or more transistors having an open drain coupled to the open drain output.

25. The memory module of claim 24, wherein the notification circuit is configured to generate the notification signal by driving a gate of each of the one or more transistors to a logic high level such that the open drain of each of the one or more transistors provides a low impedance path to ground.

26. The memory module of claim 24, wherein the notification circuit is configured to generate the parity error signal by by driving a gate of each of the one or more transistors to a logic high level such that the open drain of each of the one or more transistors provides a low impedance path to ground.

27. The memory module of claim 24, wherein the notification circuit is configured to generate the notification signal using one or more OR logic elements.

28. The memory module of claim 24, wherein the module controller comprises one or more integrated circuits.

29. The memory module of claim 21, wherein the module controller is further configured to implement the one or more training sequences in response to a signal or a command received from the memory controller of the host system.

* * * * *

(12) INTER PARTES REVIEW CERTIFICATE (2192nd)
United States Patent (10) Number: US 9,535,623 K1
Lee (45) Certificate Issued: Jul. 13, 2021

(54) MEMORY MODULE CAPABLE OF HANDSHAKING WITH A MEMORY CONTROLLER OF A HOST SYSTEM

(71) Applicant: Netlist, Inc.

(72) Inventor: Hyun Lee

(73) Assignee: Netlist, Inc.

Trial Number:

IPR2018-00303 filed Dec. 14, 2017

Inter Partes Review Certificate for:

Patent No.: 9,535,623
Issued: Jan. 3, 2017
Appl. No.: 15/169,745
Filed: Jun. 1, 2016

The results of IPR2018-00303 are reflected in this inter partes review certificate under 35 U.S.C. 318(b).

INTER PARTES REVIEW CERTIFICATE
U.S. Patent 9,535,623 K1
Trial No. IPR2018-00303
Certificate Issued Jul. 13, 2021

AS A RESULT OF THE INTER PARTES REVIEW PROCEEDING, IT HAS BEEN DETERMINED THAT:

Claims 1-29 are cancelled.

\* \* \* \* \*